United States Patent [19]
Kim et al.

[11] Patent Number: 5,886,405
[45] Date of Patent: Mar. 23, 1999

[54] SEMICONDUCTOR DEVICE PACKAGE HAVING INNER LEADS WITH SLOTS

[75] Inventors: Tae Hyeong Kim, Cheonan; Tae Sung Park, Asan; In Sik Cho; Hee Kook Choi, both of Cheonan, all of Rep. of Korea

[73] Assignee: Samsung Electronics Co., Ltd., Suwon, Rep. of Korea

[21] Appl. No.: 906,877

[22] Filed: Aug. 6, 1997

[30] Foreign Application Priority Data

Oct. 4, 1996 [KR] Rep. of Korea .................. 1996-44027

[51] Int. Cl.[6] .......................... H01L 23/48; H01L 23/495
[52] U.S. Cl. .......................... 257/692; 257/667; 257/674; 257/669
[58] Field of Search ...................... 257/667, 669, 257/674, 692, 773; 438/111, 112, 123, 124, 126, 127

[56] References Cited

U.S. PATENT DOCUMENTS

| 4,209,355 | 6/1980 | Burns | 156/630 |
| 5,150,193 | 9/1992 | Yasuhara et al. | 357/70 |
| 5,545,921 | 8/1996 | Conru et al. | 257/669 |
| 5,623,163 | 4/1997 | Izumi | 257/667 |

FOREIGN PATENT DOCUMENTS

| 403069130 | 3/1991 | Japan | 257/692 |

Primary Examiner—Valencia Martin-Wallace
Assistant Examiner—George C. Eckert II
Attorney, Agent, or Firm—Jones & Volentine, L.L.P.

[57] ABSTRACT

A semiconductor device package includes a semiconductor chip and a plurality of inner leads, each having at least one slot formed along an upper surface of the inner lead. An adhesive layer is used to attach a bottom surface of the semiconductor chip to the upper surface of the inner lead. An encapsulant is allowed to flow in a package body mold, around the inner leads and through the slot. The slots prevent the production of turbulence along a side surface of the inner lead opposite to the flow direction, thereby avoiding problems associated with incomplete encapsulation such as the internal voids.

10 Claims, 6 Drawing Sheets

FIG.8A
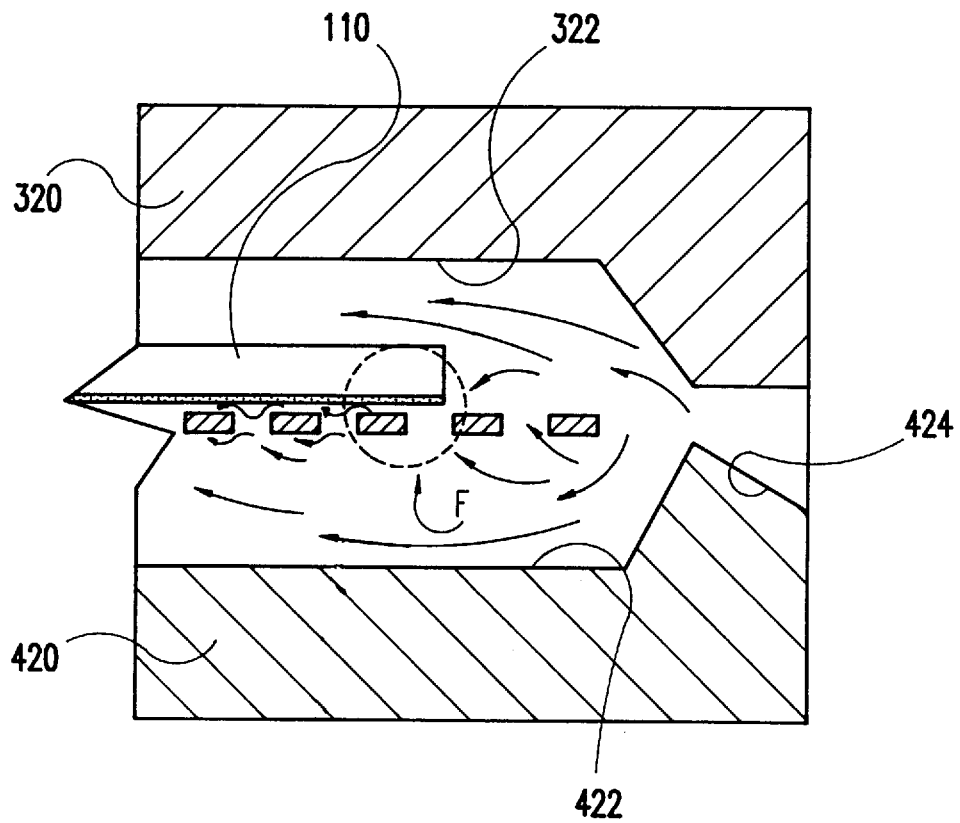
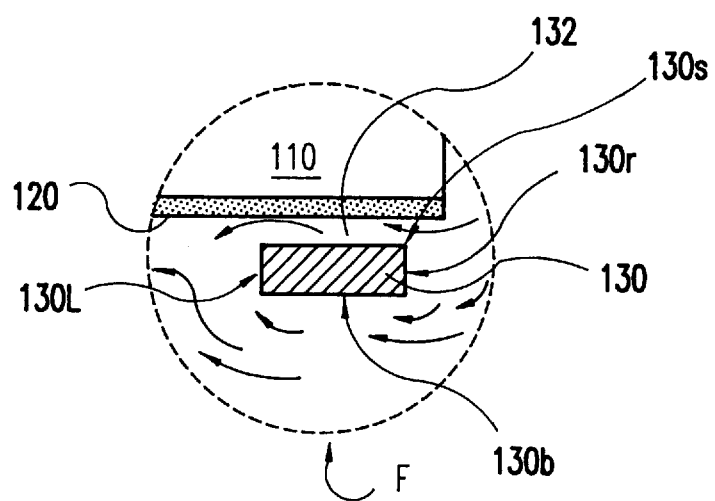
FIG.8B

SEMICONDUCTOR DEVICE PACKAGE HAVING INNER LEADS WITH SLOTS

BACKGROUND OF THE INVENTION

1. Field of the Invention

The present invention generally relates to a semiconductor device package, and more particularly, to a semiconductor device package comprising inner leads having slots formed on an upper surface of the inner leads in contact with an adhesive layer.

2. Description of the Related Art

Semiconductor chip packages have been developed to increase the mounting density of the semiconductor chip on a substrate such as a printed circuit board. However, for conventional semiconductor device packages having a die pad, since the die pad is disposed at the central region inside the package body and separated from a plurality of inner leads by a designated distance, the density of the semiconductor chip inside the package is very low.

Chip-on-Lead (COL) type packages have structures in which the die pad is removed and the bottom surface of the semiconductor chip is directly attached to the upper surfaces of the inner leads. Therefore, the density of the semiconductor chip inside the package is higher than that of the conventional package described above.

A conventional COL semiconductor chip package is depicted in FIGS. 1, 2 and 3. FIG. 1 shows a conventional COL package in a partially cut away perspective view; FIG. 2 is a cross sectional view taken along the line 2—2 of FIG. 1; and FIG. 3 is a cross sectional view taken along the line 3—3 of FIG. 1.

Referring to FIGS. 1, 2 and 3, the bottom surface 10b of a semiconductor chip 10 is directly attached to respective upper surfaces 30u of a plurality of inner leads 30 of the lead frame, which is aligned under the bottom surface 10b of the semiconductor chip 10, by an adhesive means 20 such as a polyimide tape. The semiconductor chip 10 is electrically connected to the inner leads 30 disposed on the outside of the semiconductor chip 10 by electrical connection means such as bonding wires 50.

Further, the semiconductor chip 10, the inner leads 30, and the electrical connection means including the bonding wires 50 are encapsulated with an encapsulant, such as an epoxy molding compound (EMC), to form an individual package body 60 that is protected from hostile environments. The outer leads 40 extend from the encapsulated package body 60, and are bent into a J-shape suitable to be mounted on a substrate.

FIG. 4A is a schematic view showing the flow of the EMC in the encapsulation step of the package, as viewed along the same direction as the cross section directional view of FIG. 3. FIG. 4B is a magnified view of portion E of FIG. 4A.

Referring to FIGS. 4A and 4B, the inner leads 30 and the semiconductor chip 10 are located within cavities 312 and 412 formed between an upper mold die 310 and a lower mold die 410. The cavities 312 and 412 are encapsulated with an encapsulant which flows through a gate 414 of the lower mold die 410.

In FIGS. 4A and 4B, the arrows indicate the flow direction of the encapsulant. The encapsulant initially collides with the right surface 30r of the inner lead 30, which decreases the flow velocity of the encapsulant stream. The encapsulant then flows along the bottom surface 30b of the inner leads 30, and finally to the left side 301 of the inner leads 30. As shown in FIG. 4B, the encapsulant flow is disturbed or turbulent on the left surface 301 due to the difference in the flow velocity. Again, the upper surface 30u of the inner leads 30 is attached to the bottom surface 10b of the semiconductor chip 10.

In particular, in situations were the pitch between the inner leads is very fine, or where there are a large number of inner leads, the turbulence of the encapsulant becomes more serious. Such turbulence produces internal voids and incomplete encapsulation. These internal voids swell when penetrated by a vapor, which is introduced during reliability testing carried out under severe conditions such as high temperature, pressure and humidity. An incomplete encapsulation of the package body also causes the mechanical strength of the package to deteriorate.

SUMMARY OF THE INVENTION

Accordingly, an object of the present invention is to provide a semiconductor chip package that prevents incomplete encapsulation such as internal voids by reducing the difference in the flow velocities of the encapsulant inside the package.

To achieve this and other objects and advantages, the present invention provides for a semiconductor device package which comprises a semiconductor chip; a plurality of inner leads, each having at least one slot formed along an upper surface of the inner lead; an adhesive means for attaching a bottom surface of the semiconductor chip to the upper surface of the inner lead; an electrical connection means for electrically connecting the semiconductor chip to the corresponding one of the inner leads; an encapsulant for encapsulating the semiconductor chip, the inner leads, the adhesive means, and the electrical connection means; and a plurality of outer leads formed integrally with corresponding ones of the inner leads and extending from the encapsulant.

The slots allow encapsulant to flow therethrough, thereby preventing the production of turbulence along a side surface of the inner lead opposite to the flow direction, thereby avoiding problems associated with incomplete encapsulation such as the internal voids.

BRIEF DESCRIPTION OF THE DRAWINGS

These and various other features and advantages of the present invention will be described below with reference to the accompanying drawings, wherein like reference numerals designate like structural elements, and, in which:

FIG. 8A is a schematic view showing the flow of the EMC in the encapsulation step of package; and FIG. 8B is a magnified view of portion F of FIG. 8A.

DETAILED DESCRIPTION OF THE PREFERRED EMBODIMENTS

Figure 1:
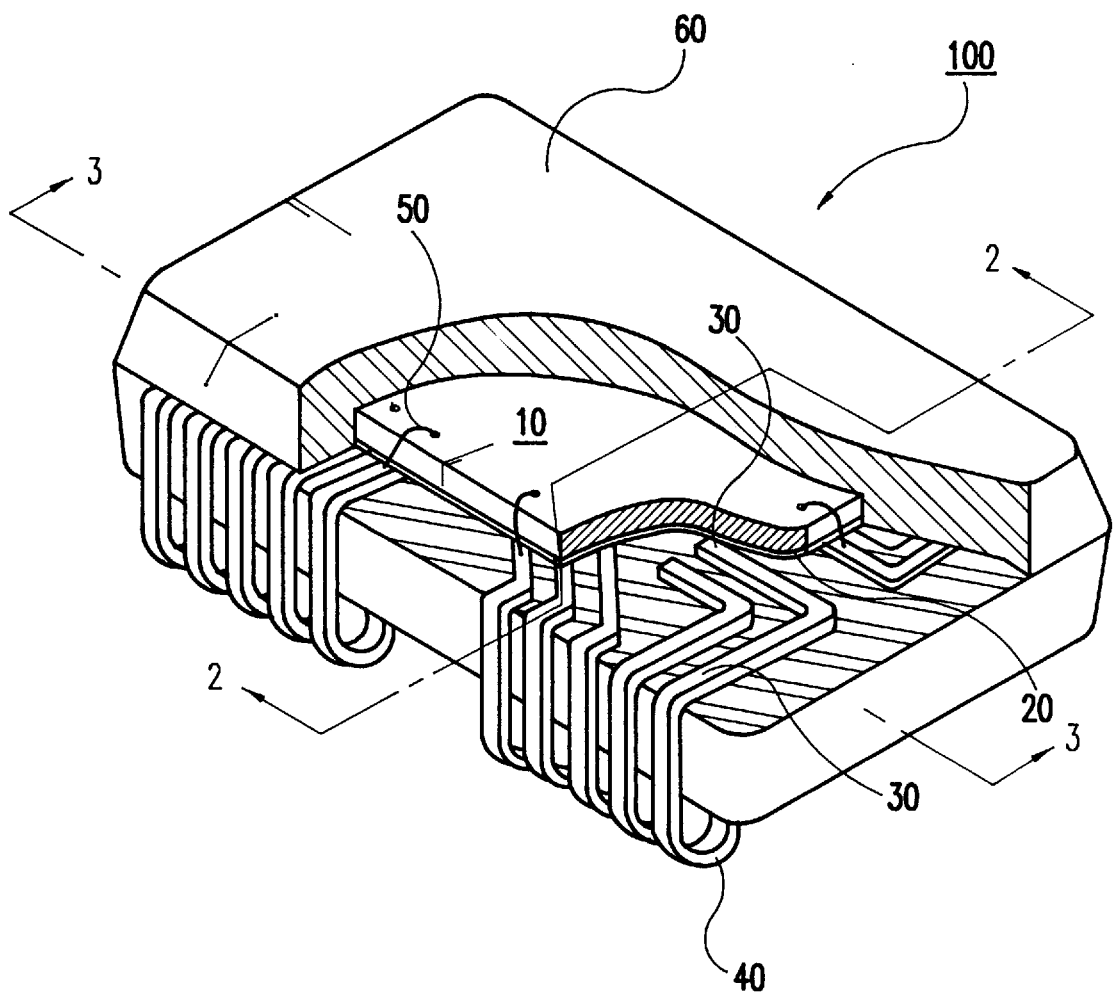
FIG. 1 is a partially cut away perspective view of a conventional COL type package.
Figure 2:
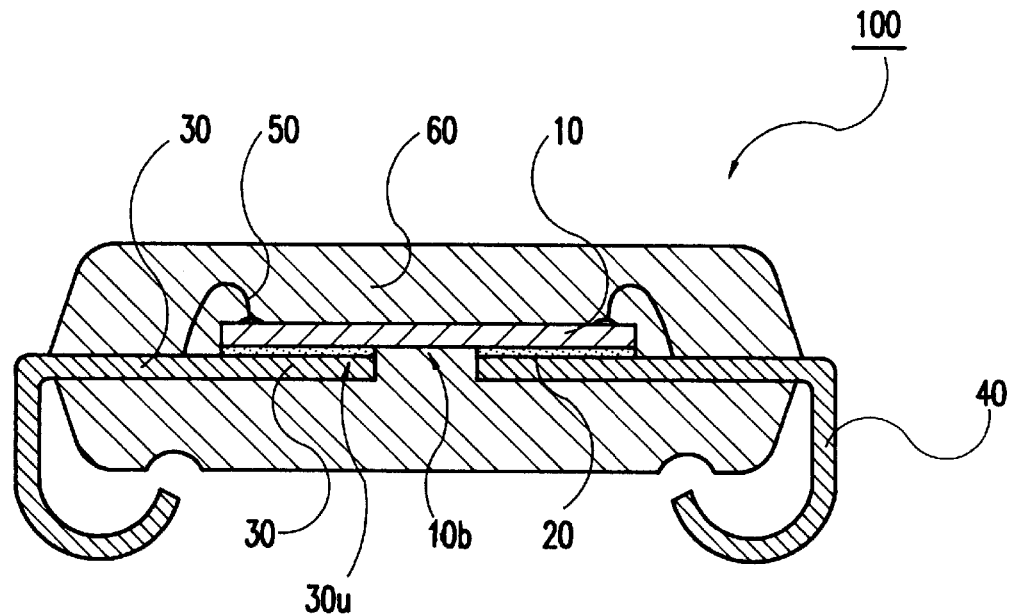
FIG. 2 is a cross sectional view taken along the line 2—2 of FIG. 1.
Figure 3:
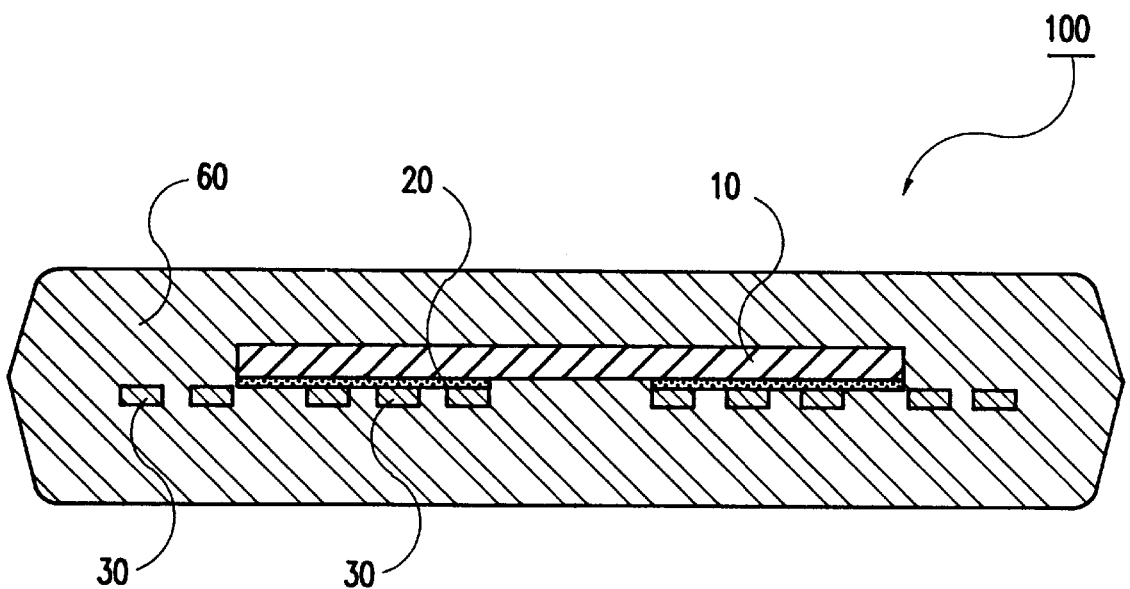
FIG. 3 is a cross sectional view taken along the line 3—3 of FIG. 1.

A preferred embodiment of the present invention will now be described below with reference to the accompanying drawings.

Referring to FIGS. 5A, 5B, 6 and 7, a bottom surface 110*b* of a semiconductor chip 110 is directly attached to upper surfaces 130*a* of the inner leads 130 of the lead frame which is aligned under the bottom surface 110*b* of the semiconductor chip 110, by an adhesive means 120. The semiconductor chip 110 is electrically connected to the inner leads 130 disposed on the outside of the semiconductor chip 110 by electrical connection means such as bonding wires 150.

Respective slots 132 are formed at a designated area on the upper surface 130*u* of corresponding ones of the inner leads 130, where the upper leads 130 are attached by the adhesive layer 120 to the bottom surface 110*b* of the semiconductor chip 110. More specifically, the slots 132 are formed on the upper surface 130*u* of the inner leads 130 approximately halfway between edges 120*a* and 120*b* of the adhesive layer 120. The slots 132 extend along the width, w, of the respective inner leads 130 and have a thickness, t, that is approximately one-half the thickness, T, of the inner lead 130. The slots 132 have a length, L, that is approximately one-third the distance between the edges 120*a* and 120*b* of the adhesive layer 120

The lower surfaces 134 at the inner distal portions of the inner leads 130, underlying the semiconductor chip 110, are partially etched by stamping or etching methods, such that the lower surfaces 134 are thinner than other parts of the inner leads 130. The lower surfaces 134 at the inner distal portions are partially etched in order to reduce stresses applied on the lower surfaces 134 when they are attached to the bottom surface 110*b* of the semiconductor chip 110. The length, L', of the etched lower surface 134 is approximately one-half that of the length, L, of slot 132.

The semiconductor chip 110, the inner leads 130, and the electrical connection means including the bonding wires 150 are encapsulated with an encapsulant, such as an EMC, to form an individual package body 160. The outer leads 140 extending from the encapsulated package body 160 are bent into a J-shape suitable to be mounted on a substrate. The slots 132 of the inner leads 130 allow the encapsulant to flow therethrough.

Figure 7:
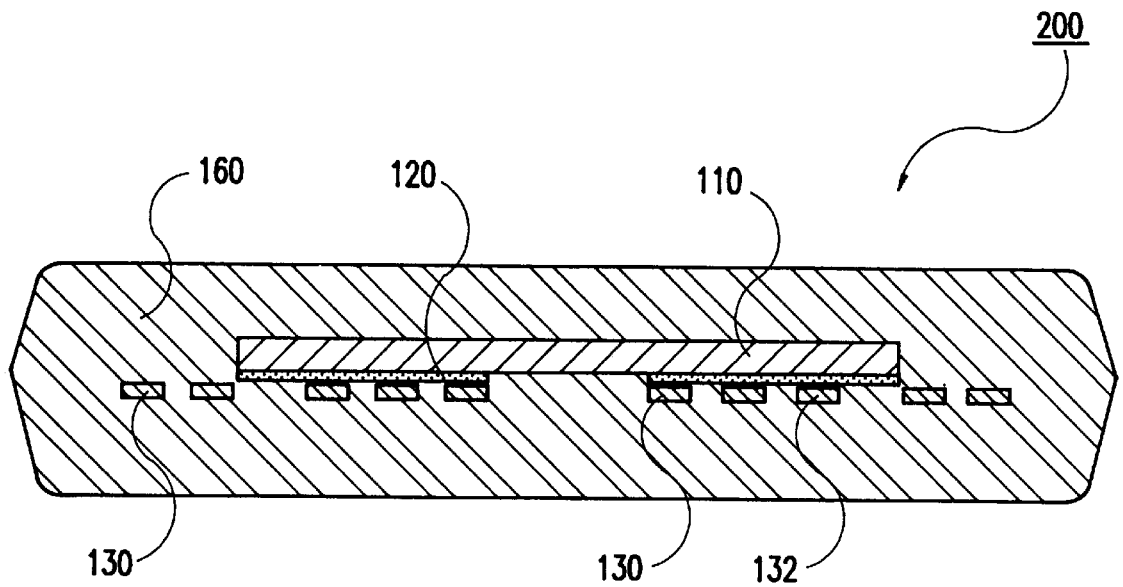
FIG. 7 is a cross sectional view taken along the line 7—7 of FIG. 5.

FIG. 8A is a schematic view showing the flow of the EMC in the encapsulation step of package, as viewed along the same direction of FIG. 7, and FIG. 8B is a magnified view of the portion F of FIG. 8A.

Figure 4A:
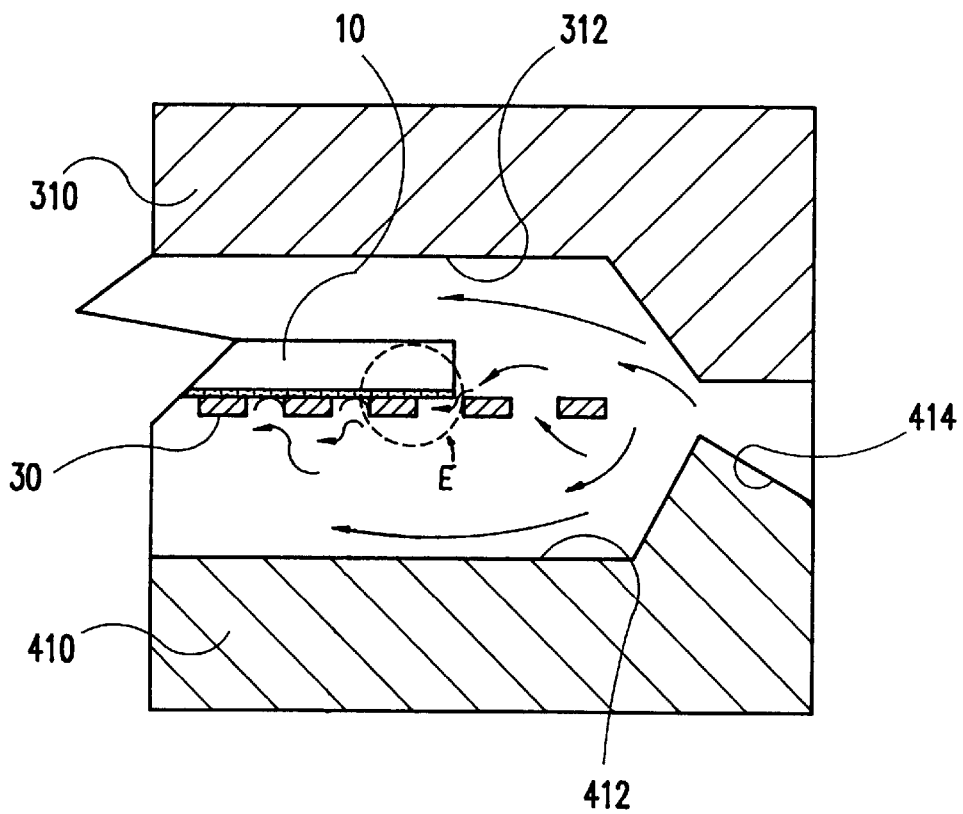
FIG. 4A is a side schematic view showing the flow of the EMC in the encapsulation step of the package.
Figure 4B:
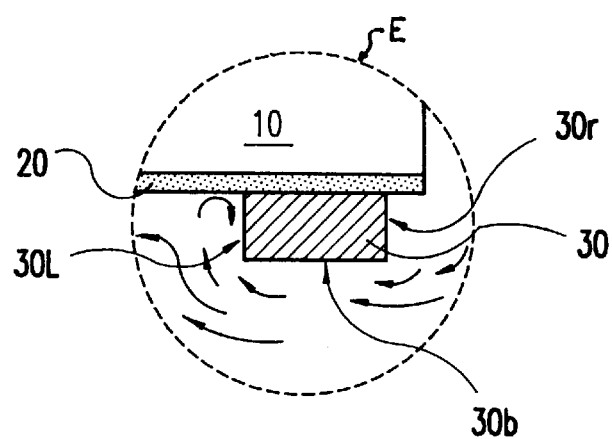
FIG. 4B is a magnified view of portion E of FIG. 4A.
Figure 5A:
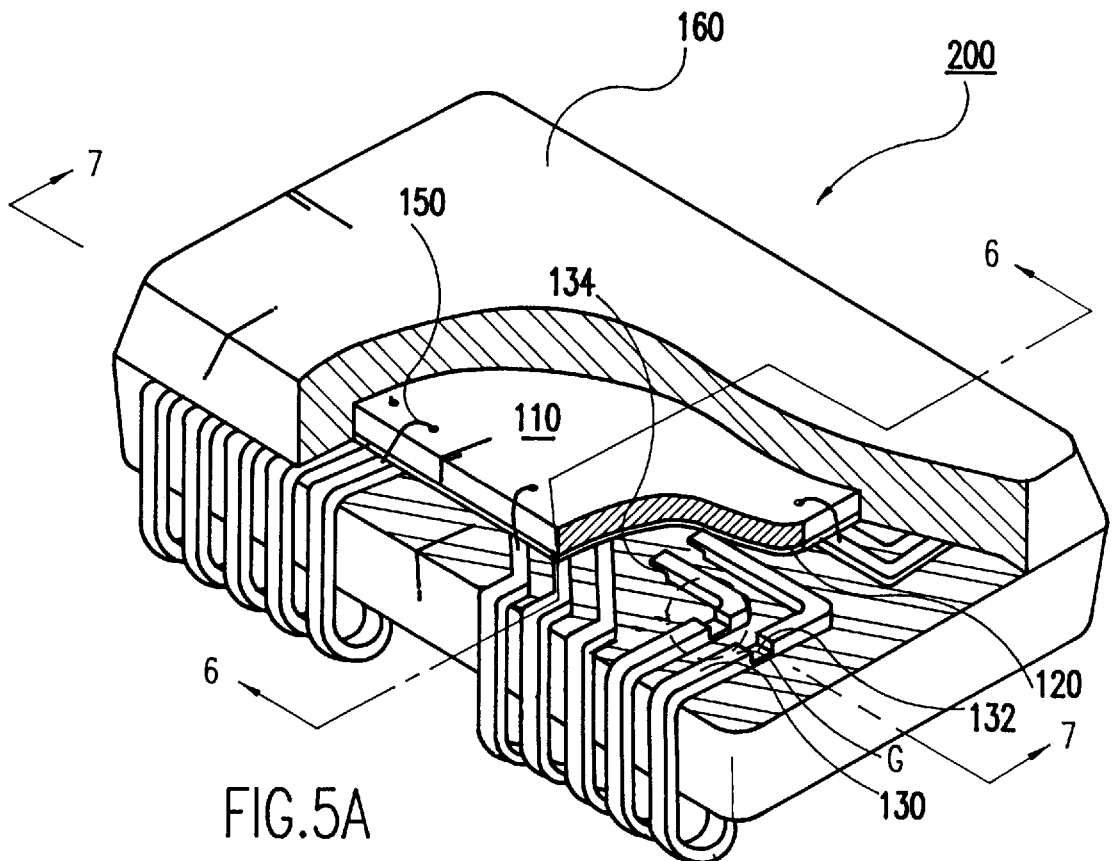
FIG. 5A is a partially cut away perspective view of a COL type package according to an embodiment of the present invention.
Figure 5B:
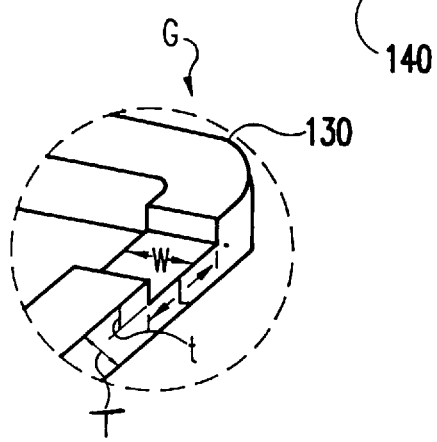
FIG. 5B is a magnified view of portion G of FIG. 4A.
Figure 6:
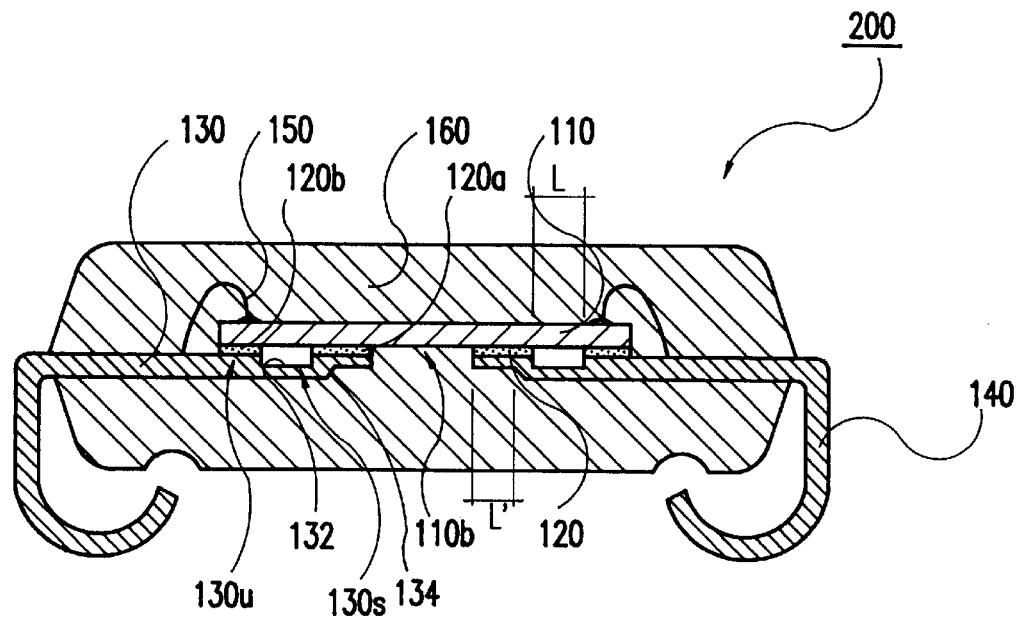
FIG. 6 is a cross sectional view taken along the line 6—6 of FIG. 5.

Referring to FIGS. 8A and 8B, the inner leads 130 and the semiconductor chip 110 are located within cavities 322 and 422 formed between an upper mold die 320 and a lower mold die 420. The cavities 322 and 422 are encapsulated with an encapsulant which flows through a gate 424 of the lower mold die 420. The turbulence which had been produced in the conventional package in FIGS. 4A and 4B will be reduced in the present invention, since the encapsulant passes through the slots 132 along the upper surface 130*s* of the slot 132 as well as around the right (130*r*), bottom (130*b*) and left (130*l*) surfaces of the inner lead 130. The slots 132 thus facilitate the flowing of the encapsulant in the direction represented by arrows and prevent the production of turbulence at these locations, thereby avoiding problems associated with incomplete encapsulation such as the internal voids.

Although the slot 132 described herein is formed at a designated location on the upper surface of the inner lead, with a certain width, thickness and length, it should be clearly understood that many variations and/or modifications of the location, the number, the length, the thickness, and the width of the slot herein taught, which may appear to those skilled in the art, will still fall within the spirit and scope of the present invention as defined in the appended claims.

What is claimed is:

1. A semiconductor device package comprising:
   a plurality of inner leads, each having at least one slot formed along an upper surface of the inner lead;
   a semiconductor chip disposed on the inner leads, wherein the slots of the plurality of inner leads are spaced apart from an edge of the semiconductor chip;
   an adhesive means disposed between the semiconductor chip and the plurality of inner leads for attaching a bottom surface of the semiconductor chip to the upper surface of the inner lead;
   an electrical connection means for electrically connecting the semiconductor chip to the corresponding one of the inner leads;
   an encapsulant for encapsulating the semiconductor chip, the inner leads, the adhesive means, and the electrical connection means; and
   a plurality of outer leads formed integrally with corresponding ones of the inner leads and extending from the encapsulant.

2. A semiconductor device package of claim 1, wherein said encapsulant is disposed in the slots.

3. A semiconductor device package of claim 2, wherein a width of each slot is equal to a width of the inner lead.

4. A semiconductor device package of claim 2, wherein the slot of a lead of the plurality of leads is oriented so that the encapsulant disposed in the slot is contiguous across the lead in a flow direction substantially parallel to a predetermined encapsulating direction, the encapsulating direction defined relative to the semiconductor chip by a line connecting the semiconductor chip in a mold to a gate in the mold during the encapsulating.

5. A semiconductor device package of claim 3, said slot being formed halfway between edges of said adhesive means.

6. A semiconductor device package of claim 5, wherein a thickness of each slot is one-half a thickness of the inner lead.

7. A semiconductor device package of claim 6, wherein a length of each slot is equal to one-third of a distance between the edges of the adhesive means.

8. A semiconductor device package of claim 1, wherein lower surfaces of distal portions of the inner leads underlying said semiconductor chip are partially etched.

9. A semiconductor device package of claim 8, wherein said distal portion has a length equal to about one-half a length of a slot.

10. A semiconductor device package comprising:
    a semiconductor chip;
    a plurality of inner leads, each having at least one slot formed along an upper surface of the inner lead;
    an adhesive means for attaching a bottom surface of the semiconductor chip to the upper surface of the inner lead, wherein said slot is disposed halfway between edges of said adhesive means;
    an electrical connection means for electrically connecting the semiconductor chip to the corresponding one of the inner leads;
    an encapsulant for encapsulating the semiconductor chip, the inner leads, the adhesive means, and the electrical connection means; and
    a plurality of outer leads formed integrally with corresponding ones of the inner leads and extending from the encapsulant.

* * * * *